United States Patent [19]

Ishioka et al.

[11] Patent Number: 4,733,285
[45] Date of Patent: Mar. 22, 1988

[54] SEMICONDUCTOR DEVICE WITH INPUT AND/OR OUTPUT PROTECTIVE CIRCUIT

[75] Inventors: Hiroshi Ishioka; Tohru Tsujide; Makoto Miyazawa, all of Tokyo, Japan

[73] Assignee: NEC Corporation, Tokyo, Japan

[21] Appl. No.: 758,353

[22] Filed: Jul. 24, 1985

[30] Foreign Application Priority Data

Jul. 24, 1984 [JP] Japan .................. 59-153649

[51] Int. Cl.$^4$ ...................... H01L 29/78; H01L 27/02; H01L 29/04
[52] U.S. Cl. .................. 357/23.13; 357/41; 357/51; 357/59
[58] Field of Search ............... 357/23.13, 51, 52, 59, 357/41, 42, 53

[56] References Cited

U.S. PATENT DOCUMENTS

| | | | |
|---|---|---|---|
| 4,044,373 | 8/1977 | Nomiya et al. | 357/23.13 |
| 4,288,829 | 9/1981 | Tango | 357/51 |
| 4,509,067 | 4/1985 | McNami et al. | 357/51 |
| 4,616,243 | 10/1986 | Minato et al. | 357/23.13 |

FOREIGN PATENT DOCUMENTS

| | | | |
|---|---|---|---|
| 0043284 | 1/1982 | European Pat. Off. | 357/23.13 |
| 0076967 | 4/1983 | European Pat. Off. | 357/53 |
| 57-7976 | 1/1982 | Japan | 357/23.13 |

Primary Examiner—J. Carroll
Attorney, Agent, or Firm—Burns, Doane, Swecker & Mathis

[57] ABSTRACT

An MOSIC is provided with an input and/or output protective circuit which includes a first semiconductor region formed in a semiconductor substrate with a PN junction and electrically coupled between an input or output terminal and a transistor to be protected and a second semiconductor region formed so as to surround the first region. The PN junction formed between the second region and the substrate is reverse-biased, whereby the second region absorbs carriers which are undesirably injected from the first region into the substrate in an electrical operation of the IC.

11 Claims, 9 Drawing Figures

SEMICONDUCTOR DEVICE WITH INPUT AND/OR OUTPUT PROTECTIVE CIRCUIT

BACKGROUND OF THE INVENTION

The present invention relates to a semiconductor device, and particularly to an integrated circuit device of a metal-oxide-semiconductor type (called hereinafter as an "MOSIC") provided with an input and/or output protective circuit.

An MOSIC is provided with an input and/or output protective circuit which protects MOS transistor(s) connected to each input or output terminal from the destruction caused by the discharge of static electrical charges. The protective circuit usually comprises a resistive element having one end connected to the input or output terminal and a semiconductor region formed in a semiconductor substrate to form a PN junction therebetween. The semiconductor region is connected to the other end of the resistive element and further connected to the transistor to be protected. The static electrical charges are thereby discharged toward the substrate through the resistive element and the PN junction, thereby protecting the transistor connected to the input or output terminal.

When the MOSIC is in use, the input or output terminal is often supplied with a noise voltage which sometimes has such a polarity that forward biases the PN junction formed between the semiconductor region and the substrate. In that case, electrons or holes are injected into the substrate, with the result that they function as a trigger current for turning ON the parasitic thyristor formed in a complementary MOSIC to cause the so-called "latch-up phenomenon". More specifically, in the complementary MOSIC, a well region of one conductivity type is formed in the substrate of the other conductivity type, and source and drain regions of the other conductivity type are provided in the well region to form a MOS transistor. The semiconductor region of the protective circuit is formed in the substrate to have the one conductivity type, that is, the same conductivity type as the well region. Therefore, the parasitic thyristor is constituted by n-p-n-p or p-n-p-n structure of the semiconductor region of the protective circuit, the substrate, the well region and the source or drain region formed in the well region. The electrons or holes caused by the noise voltage supplied to the input or output terminal may thus trigger the parasitic thyristor to cause the latch-up phenomenon.

Even if the MOSIC is not of the complementary type, the aforementioned electrons or holes bring about an undesirable effect upon the MOSIC. For example, where a DRAM (Dynamic Random Access Memory device) is formed as an MOSIC, the injected electrons or holes often destroy data stored in memory cells. More specifically, the memory cells of the so-called "one-transistor" type are employed in the DRAM in order to enhance the memory capacity without increasing the cost. The one-transistor memory cell consists of one MOS transistor and a storage capacitor. The MOS transistor operates as a transfer gate, and the storage capacitor holds the data as electrical charges therein. The source region of the MOS transistor is also used as one of electrodes of the storage capacitor, and therefore the storage capacitor is equivalently coupled to tbe semiconductor substrate. The electrons or holes injected into the substrate due to the noise voltage may reach the storage capacitor so that the electrical charges in the storage capacitor may be changed to cause the destruction of the data stored in the memory cell.

SUMMARY OF THE INVENTION

It is, therefore, an object of the present invention to provide a semiconductor device equipped with an improved input and/or output protective structure.

Another object of the present invention is to provide an MOS type integrated circuit device free from maloperation caused by a noise voltage applied to an input and/or output terminal.

Still another object of the present invention is to provide a complementary MOS type integrated circuit device in which the latch-up phenomenon is prevented.

It is still another object of the present invention to provide a semiconductor memory device of a dynamic random access type in which the stored data is protected from the destruction caused by an input noise voltage.

A semiconductor device according to the present invention comprises a semiconductor substrate of one conductivity type, an electrode pad formed on an insulating film covering the substrate, a first semiconductor region of the opposite conductivity type formed in the substrate, a first conductive means connecting the electrode pad to the first semiconductor region, a transistor formed in the substrate; a second conductive means connecting the first semiconductor region to the transistor, a second semiconductor region of the opposite conductivity type formed in the substrate so as to surround the first semiconductor region, and a third conductive means supplying a bias voltage to the second semiconductor region to reverse-bias a PN junction formed between the second semiconductor region and the substrate.

In this structure, the static electrical charges are discharged from the electrode pad via the first conductive means and the first region to the substrate, whereby the transistor is protected from the destruction. When the semiconductor device of this structure is in a practical use and a noise voltage of such polarity is applied to the electrode pad that forward biases a PN junction formed between the first region and the substrate, electrons or holes injected from the first region into the substrate are remarkably absorbed into the second region, and do not substantially reach a portion in which the transistor is formed. The second region is formed in the substrate so as to surround the first region, and the PN junction formed between the second region and the substrate is reverse-biased by the bias voltage supplied to the second region. Accordingly, when the PN junction formed between the first region and the substrate is forward biased by the noise voltage applied to the electrode pad, the first region, a portion of the substrate between the first and second regions, and the second region operate as a lateral NPN or PNP transistor. The first region functions as an emitter region of the lateral transistor, and the second region operates as the collector region thereof. The electrons or holes injected from the first region is thereby absorbed by the second region as a collector current of the lateral transistor. As a result, the injected electrons or holes are thus remarkably reduced and, even when reaching the internal transistors, do not cause the latch-up phenomenon in the complementary MOSIC and the destruction of the stored data in the DRAM.

It is favorable that the second region is formed more deeply than the first region so that the injected electrons or holes are absorbed by the second region more effectively. It is convenient that in the complementary MOSIC the second region is formed simultaneously with a well region, whereby the second region is formed deeply without an additional manufacturing step for the deep formation of the second region.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Figure 1:
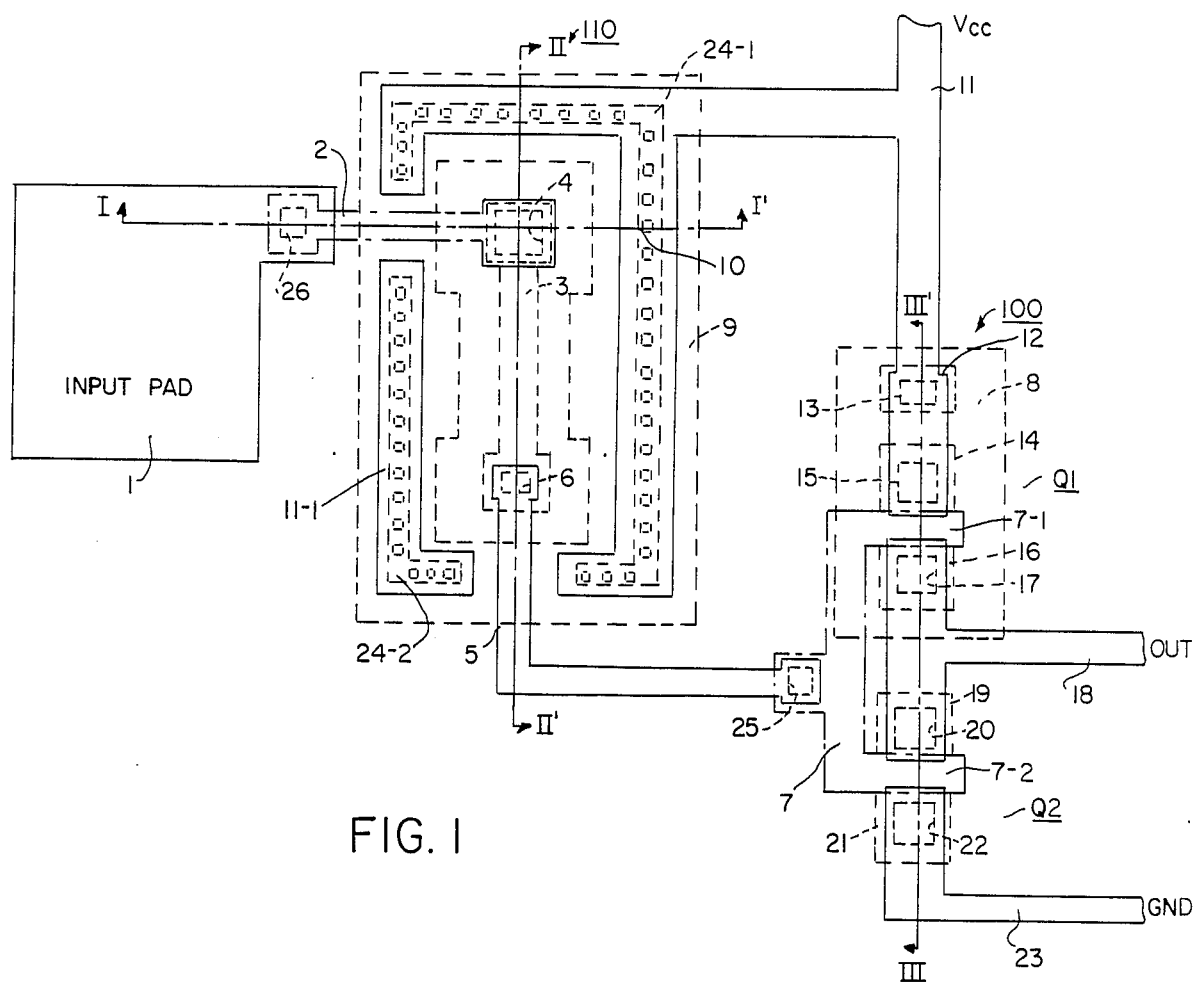
FIG. 1 is a plan view showing a part of a semiconductor device according to a first embodiment of the present invention.
Figure 2:
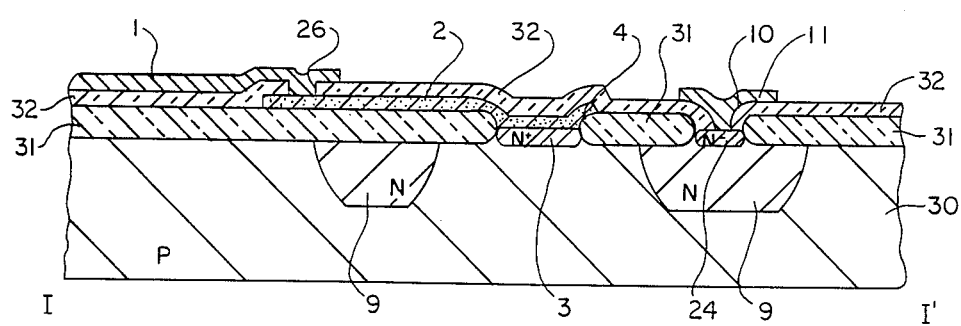
FIG. 2 is a cross sectional view along a line I-I' in FIG. 1.
Figure 3:
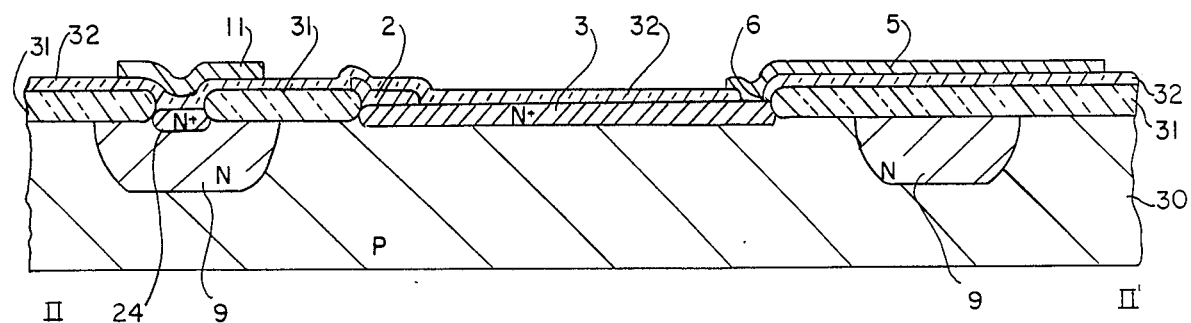
FIG. 3 is a cross sectional view along a line II-II' in FIG. 1.
Figure 4:
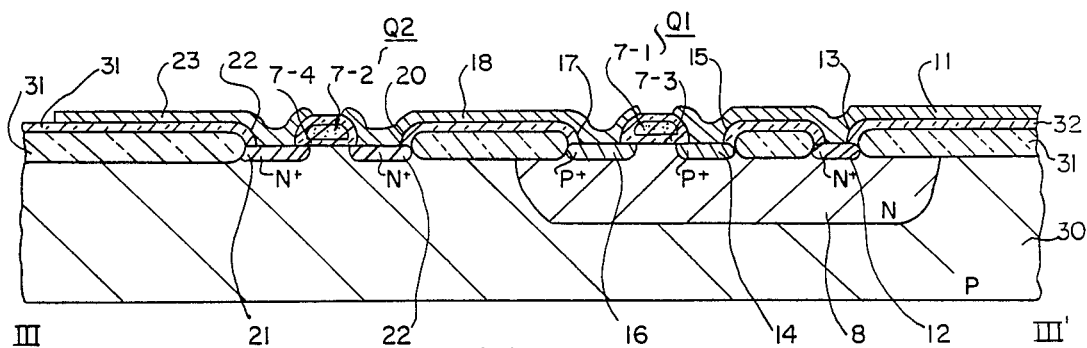
FIG. 4 is a cross sectional view along a line III-III' in FIG. 1.

Referring to FIG. 1, there is shown a plan view of a semiconductor device according to a first embodiment of the present invention. Cross sectional views along lines I-I', II-II' and III-III' in FIG. 1 are shown in FIGS. 2, 3 and 4, respectively. This semiconductor device is a complementary MOSIC comprising a plurality of first channel type MOS transistors and second channel type MOS transistors, but only one first channel type MOS transistor $Q_1$ and one second channel type MOS transistor $Q_2$ are shown in these figures. In this embodiment, the transistors $Q_1$ and $Q_2$ are a P-channel type and an N-channel type, respectively, and they constitute an inverter circuit 100 as an input stage for receiving an input signal through an electrode pad 1 as an input terminal.

As shown in FIGS. 1 and 4, the transistor $Q_1$ has P-type source and drain regions 14 and 16 formed in an N-type well region 8 which is selectively provided in a P-type substrate 30. A gate electrode 7-1 made of polycrystalline silicon is formed on a gate insulation film 7-3 made of a silicon dioxide covering a portion of the well region 8 between the source and drain regions 14 and 16. The source region 14 is connected to a power supply wiring layer 11 made of a metal such as aluminum and applied with a power potential Vcc through a contact hole 15 which is provided an insulating film 32 made of a silicon dioxide. The substrate 30 is selectively covered with another insulating film 31 which is formed by the so-called LOCOS (Local Oxidation of Silicon) technology, and the insulating film 31 in thus partially buried in the substrate 30. The power supply wiring layer 11 is also in contact with an $N^+$-type region 12 by a contact hole 13. The region 12 is formed in the well region with a high impurity concentration and thus operates as a electrode lead-out region. The well region is thereby biased by the power potential Vcc.

The transistor $Q_2$ has N-type source and drain regions 21 and 22 formed in the substrate 30 and a gate electrode 7-2 made of polycrystalline silicon and provided on a gate insulating film 7-4 made of a silicon dioxide. The source region 21 of the transistor $Q_2$ is connected through a contact hole 22 to a ground wiring layer 23 applied with a ground potential. The gate electrodes 7-1 and 7-2 of the transistors $Q_1$ and $Q_2$ are interconnected with each other as a gate wiring layer 7. An output signal of the input inverter circuit 100 is derived from an output wiring layler 18 which is made of aluminum and connected to the drain regions 16 and 22 of the transistors $Q_1$ and $Q_2$. The input electrode pad, i.e. the input terminal 1, is formed on the insulating film 31 with a predetermined area and supplied with an input signal to be introduced into the input inverter stage 100 from an external signal source (not shown).

There is further provided an input protective circuit 110 between the input terminal 1 and the input inverter stage 100, for protecting the gate insulating films 7-3 and 7-4 of the transistors $Q_1$ and $Q_2$ from the destruction caused by the discharge of static electrical charges. More specifically, the input protective circuit 110 comprises, as shown in FIGS. 1 to 3, a resistive element 2 made of polycrystalline silicon and a diffused region 3 of an N-type formed in the substrate. The resistive element, i.e. the polycrystalline silicon layer 2, is doped with N-type impurities to obtain a required resistance value and connected at its one end to the input electrode pad 1 by a contact hole 26 provided in the insulating film 32. The silicon layer 2 is formed on the insulating film 31 and thus isolated from the substrate 30. The layer 2 is further elongated over the insulating film 31 and having the other end portion which is in contact with one end portion of the region 3 by a contact hole 4. The region 3 is formed in a strip shape to provide an additional resistance component. The other end portion of the region 3 is connected through a contact hole 6 to a wiring layer 5 made of aluminum. The wiring layer 5 is extended over the insulating film 32 and then connected by a contact hole 25 to the gate wiring layer 7.

As well known in the art, the IC is equipped with a plurality of external lead-out terminals each electrically connected to one of electrode pads provided on a semiconductor chip, for receiving the power supply potentials and input signals to be processed and outputting the processed signals, and at least one of the external lead-out terminals is often charged with the static electricity in the custody condition or the conveying state of the IC. If another external lead-out terminal is electrically grounded in such a state, the static electrical charges on the one external lead-out terminal are discharged via the internal circuit elements in the IC to the ground terminal.

Assume in FIG. 1 that the external lead terminal connected to the input terminal 1 is charged with the static electricity. The static electrical charges are intended to be discharged into the transistors $Q_1$ and $Q_2$. However, a PN junction formed between the N-type region 3 and the P-type substrate 30 is turned ON by the static electricity, so that the static electrical charges are substantially discharged into the substrate 30. Moreover, since the polycrystalline layer 2 operates as a resistor and the region 3 also has a resistance component, the discharge current by the static electrical charges is suppressed. As a result, the transistors $Q_1$ and $Q_2$, in particular their gate insulating films 7-3 and 7-4, are protected from the destruction.

In an electrical operation state of the IC, each external lead terminal is supplied with a predetermined potential or signal, and therefore any external lead terminal is not charged with the static electricity. In such a state, however, the input terminal connected to the input electrode pad 1 is often subjected to a noise voltage, and further the noise voltage may have such a polarity that farward biases the PN junction formed between the N-type region 3 and the P-type substate 30. As a result, electrons are injected from the region 3 into the substrate 30. If these electrons reach the substrate portion in which the transistors $Q_1$ and $Q_2$ are formed, the parasitic thyristor constituted by the N-type region 3, the P-type substrate 30, the N-type well region 14 and the P-type source or drain region 14 or 16 is triggered to be turned ON. As a result, the so-called latch-up phenomenon occurs to bring the IC into the maloperation. If the IC includes the one-transistor memory cell array, the data stored in the memory cell may be destroyed by the injected electrons 200.

In the IC shown in FIGS. 1 to 4, however, the injected electrons 200 are absorbed into an N-type region 9, and do not subsutantially reach the input inverter stage. 100. More specifically, the N-type region 9 is formed in the substrate 30 to surround the region 3. Since the impurity concentration of the region 9 is relatively low, a high concentration $N^+$-type region 24 is formed as an electrode region in the region 9 along the protective region 3. It is noted that the electrode region 24 is not formed at the crossing portions between the region 3 and the polycrystalline silicon layer 2 and the metal wiring layer 5. The region 24 is thereby divided into two portions 24-1 and 24-2. The power supply wiring layer 11 is elongated over the first electrode region 24-1 along the protective region 3. A plurality of contact holes 10 are provided in the insulating film 32, so that the elongated portion of the power supply wiring layer 11 is in contact with the first electrode region 24-1 at plural points A metallic layer 11-1 is further provided, which is connected to the second electrode region 24-2 by a plurality of contact holes 10. The region 9 is thus biased by the power potential Vcc without a substantial voltage drop, so that a PN junction formed between the N-type region 9 and the P-type substrate 30 is reversely biased. If desired, only two contact holes may be provided to expose the major portions of the electrode regions 24-1 and 24-2, respectively.

According to the above-mentioned structure, the N-type region 3, the P-type substrate portion between the region 3 and 9, and the N-type region 9 constitute a lateral NPN transistor. The region 3 operates as an emitter region of the lateral NPN transistor, and the region 9 functions as a collector region thereof. The lateral transistor is made conductive by the electrons (see FIG. 2) which is injected from the region 3 into the substrate 30 by the noise voltage applied to the input electrode pad 1. The injected electrons are thereby absorbed into the region 9 as a collector current of the lateral transistor. Since the region 9 is formed more deeply than the region 3 as apparent from FIGS. 2 and 3, the absorption effect of the injected electrons is enhanced remarkably. As a result, the number of electrons which are not absorbed into the region 9 but reach the transistor formation portions, is substantially lowered, thereby preventing the latch-up phenomenon or the destruction of the stored data.

The shortening of the distance between the regions 3 and 9 increases the current amplification factor ($h_{FE}$) of the lateral NPN transistor to absorb the injected electrons more effectively, but the breakdown voltage of the lateral NPN is lowered. On the other hand, the widening distance between the regions 3 and 9 causes that the relatively large amount of the injected electrons reach the MOS transistor formation portions. It is, therefore, favorable that the distance between the regions 3 and 9 is chosen to be within a range of 3 to 10 $\mu$m. In this embodiment, that distance is designed to be 5 $\mu$m.

In process, the well region 8 and the N-type region 9 are formed simultaneously in the substrate 30. Accordingly, an additional formation step for the region 9 is not required. The substrate 30 is then covered with the insulating film 31 by the LOCOS art, and the polycrystalline silicon layers for the resistive element 2 and the gate electrodes 7-1 and 7-3 are selectively formed. The N-type impurities are thereafter diffused to form the electrode regions 24-1 and 24-2, the protective region 3, the contact region 12, and the source and drain regions 21 and 22. The source and drain regions 14 and 16 of the transistor $Q_1$ is formed by the P-type impurity diffusion. The insulating film 32 is formed to cover the entire surface, and the respective contact holed are formed in the film 32. Subsequently, the metal wiring layers 11, 11-1, 18 and 28 and the input terminal 1 are formed. It is apparent that the respective semiconductor regions may change their conductivity types.

Since the region 3 has the resistance component, the polycrystalline silicon layer 2 can be substituted with a metallic layer. A silicon layer may be employed in place of the metal wiring layer 5.

Figure 5:
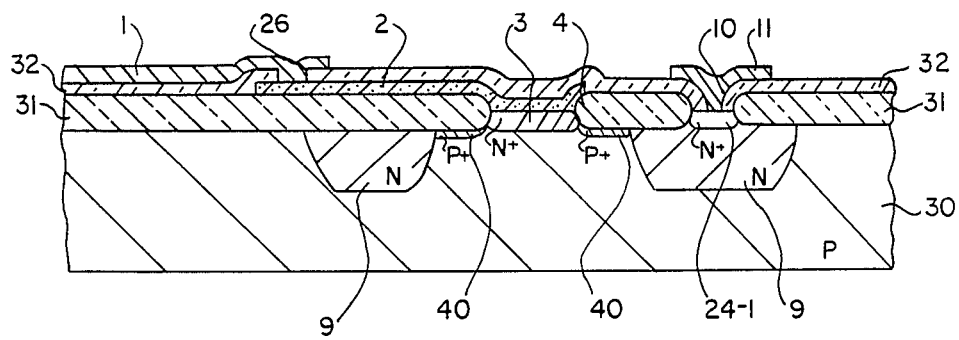
FIG. 5 is a cross sectional view representing a modified structure of FIG. 2.

The distance between the regions 3 and 9 can be shortened by suppressing the extension of the depletion layer (or space charge region) from the region 9. As shown in FIG. 5, a $P^+$-type region 40 having an impurity concentration larger than the substrate 30 is formed at the surface portion between the regions 3 and 9, thereby suppressing the extension of the depletion layer from the region 9. Since the distance between the regions 3 and 9 is shortened, the chip area occupied by them is reduced.

Figure 6:
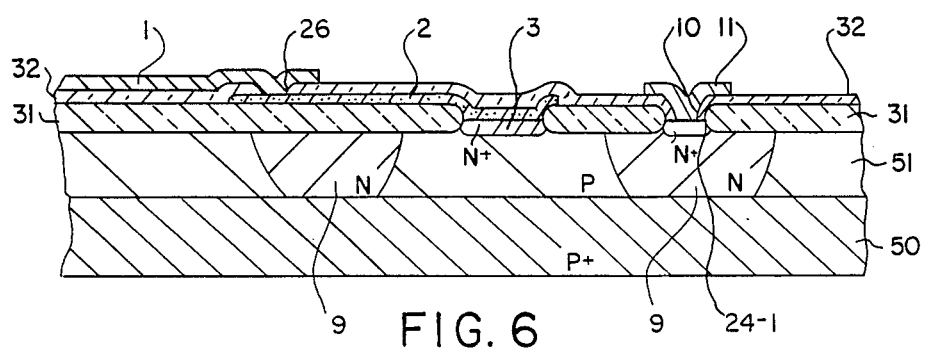
FIG. 6 is a cross sectional view showing a part of semiconductor device according to a second embodiment of the present invention.

A second embodiment of the present invention is shown in FIG. 6. In this embodiment, a P-type epitaxial layer 51 is grown on a $P^+$-type substrate 50, the input inverter stage 100 and the protective circuit 110 shown in FIGS. 1 to 4 are formed in the epitaxial layer 51. Accordingly, the same reference numerals as those used in FIGS. 1 to 4 are also employed in FIG. 6 to indicate the same constituents. The substrate 50 used in the second embodiment has the impurity concentration higher than that used in the first embodiment, and the epitaxial layer 51 is lowered in the impurity concentration.

The injected electrons due to the noise voltage supplied to the input electrode pad 1 are not absorbed perfectly into the region 9, and a part of them is supplied to the substrate 51. In the second embodiment shown in FIG. 6, the substrate 51 is formed with the high impurity concentration, and therefore the recombination between the supplied electrons and holes in the substrate 51 occurs under the region 9, thereby eliminating the arrival of the electrons to the MOS transistor formation portion.

Figure 7:
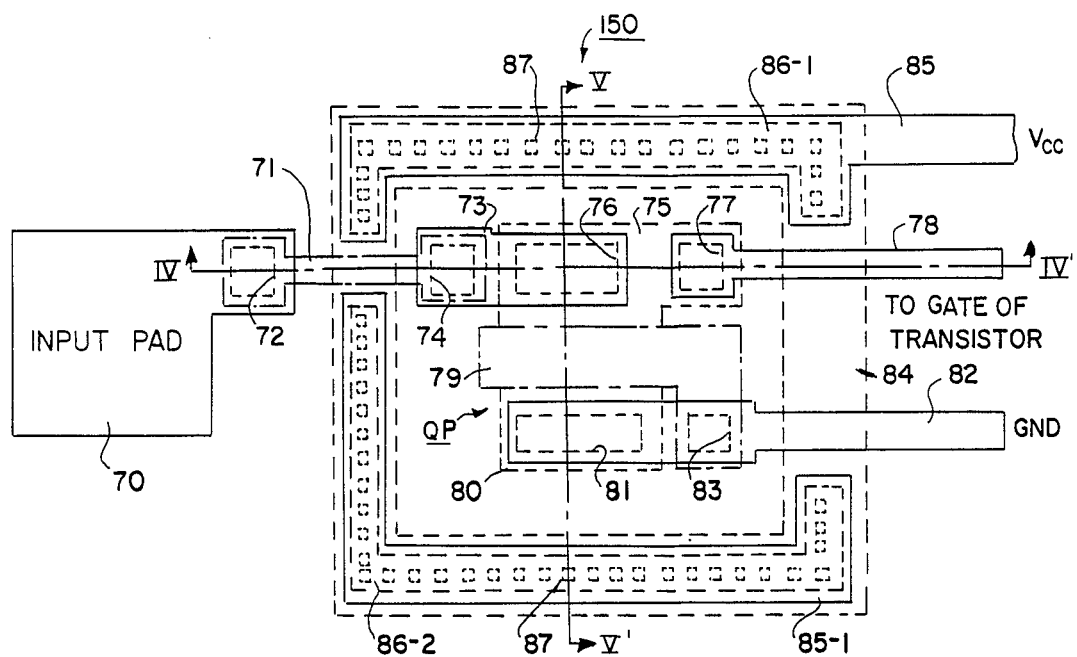
FIG. 7 is a plan view showing a part of a semiconductor device according to a third embodiment of the present invention.
Figure 8:
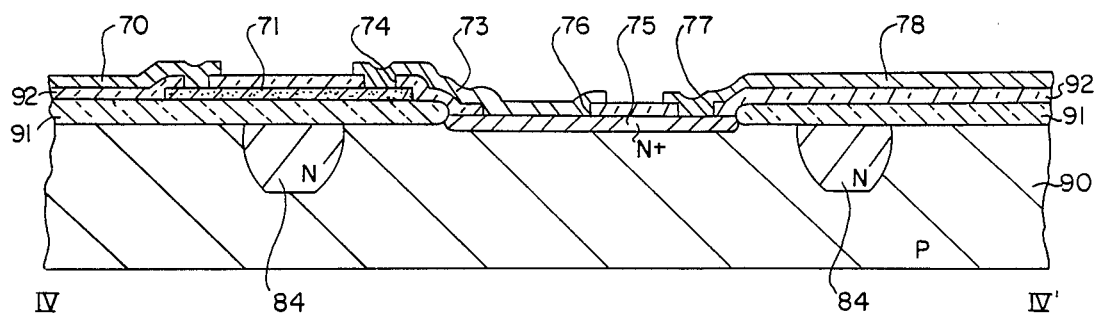
FIG. 8 is a cross sectional view along a line IV-IV' in FIG. 7.
Figure 9:
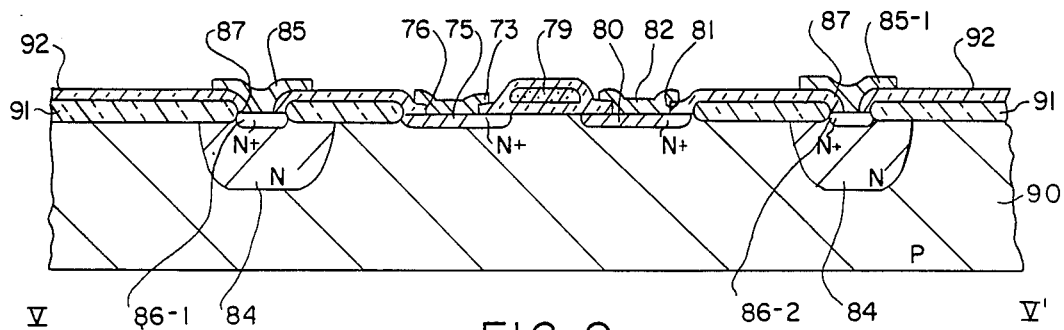
FIG. 9 is a cross sectional view along a line V-V' in FIG. 7.

In some IC's, the input protective circuit is composed of a resistive element and a protecting transistor. One of such IC's is shown in FIG. 7 as a third embodiment of the present invention. FIGS. 8 and 9 is cross sectional views along the lines IV-IV' and V-V' in FIG. 7, respectively.

An input protective circuit 150 shown in these figures comprises a polycrystalline silicon layer 71 as a resistive element and a protecting transistor QP. The silicon layer 71 is doped with N-type impurities to provide a predetermined resistance value and has one end portion connected by a contact hole 72 to an input electrode pad as an input terminal 70. The other end portion of the silicon layer 71 is connected to a metallic layer 73 through a contact hole 74. The layer 71 is formed on an insulating film 91 which is made by the selective oxidation of a silicon substrate 90. The metallic layer 73 is elongated and further connected by a contact hole 76 to an N-type drain region 75 of the protecting transistor QP. The drain region 71 is also connected through a contact hole 77 to an input wiring layer 78 which is in turn extended to the gates of MOS transistors in an input inverter stage (not shown). The gate and source of the protecting transistor QP are indicated by reference numerals 79 and 80, respectively, and they are connected to each other by a metallic ground wiring layer 82. The source region 80 is in contact with the wiring layer 82 by a contact hole 81. The gate 79 is made of polycrystalline silicon and doped with N-type impurities. The wiring layer 82 is also in contact ith the gate 79 by a contact hole 83. The static electrical charges on an input terminal (not shown) connected to the input electrode pad 70 is thereby discharged via an electrical path including the resistance layer 71 and the transistor QP, thereby protecting the MOS transistor in the input stage.

The protecting transistor QP is surrounded by an N-type region 84. It is convenient that the region 84 is formed simultaneously with the formation of an N-type well region (not show) in which a P-channel MOS transistor is formed. First and second electrode regions 86-1 and 86-2 are formed in the region 84. A metallic layer 85 supplied with a power potential Vcc is elongated over the region 86-1. Another metallic layer 85-1 is formed over the region 86-2. A plurality of contact holes 87 connects the metallic layers 85 and 85-1 to the electrode regions 86-1 and 86-2, respectively. The region 84 is thereby biased by the power potential Vcc without a substantial voltage drop, so that a PN junction formed between the region 84 and the substrate 90 is reversely biased. Accordingly, the region 84 absorbs, by the transistor action electrons which is injected from the drain 75 and/or source 80 of the protecting transistor PQ into the substrate 90 due to a noise voltage supplied to the input electrode pad 70 in an electrical operation state.

As described above, the present invention provides an MOSIC free from the latch-up phenomenon or the malooperation of the internal circuit.

The present invention is not limited to the aforementioned embodiments, but may be modified and changed without departing from the scope and spirit of the presention invertion. For example, an output protective circuit for protecting an output transistor also has a semiconductor region formed in a substrate with a PN junction, and hence this region can be surrounded by a biased region in accordance with the present invention. Moreover, the present invention is applicable to IC's other than a complementary MOS type.

What is claimed is:

1. A semiconductor device comprising a semiconductor substrate of one conductivity type, a terminal means formed on an insulating film covering said substrate, a first semiconductor region of opposite conductivity type formed in said substrate, a first conductive means electrically connecting said terminal means to said first semiconductor region, a transistor forming portion provided in said substrate and including a plurality of transistors, a second conductive means electrically connecting said first semiconductor region to at least one of said transistors, a second semiconductor region of said opposite conductivity type formed in said substrate and interposed between said first semiconductor region and said transistor forming portion, said second semiconductor region having a depth larger than that of said first semiconductor region, and a third conductive means for supplying a bias potential to said second semiconductor region to reverse-bias a PN junction formed between said semiconductor region and said substrate, wherein said PN junction formed between said second semiconductor region and said substrate completely surrounds a PN junction of said first semiconductor region.

2. The semiconductor device as claimed in claim 1, wherein said first conductive means includes a polycrystalline silicon layer doped with impurities.

3. The semiconductor device as claimed in claim 1, wherein said one transistor is an insulated gate field effect transistor and the gate of said transistor is connected by said second conductive means to said first semiconductor region.

4. A semiconductor device comprising a semiconductor substrate of one conductivity type, an input terminal supplied with an input signal, a well region of opposite conductivity type formed in said substrate, an insulated gate field effect transistor formed in said well region, a first region of said opposite conductivity type formed in said substrate and having a junction depth shallower than said well region, a first conductive layer connecting said input terminal to said first region, a second conductive layer connecting said first region to the gate of said transistor, a second region of said opposite conductivity type formed in said substrate and disposed between said first region and said well region, said second region having a junction depth substantially equal to the junction depth of said well region and completely surrounding said first region, and a third conductive layer supplying said second region with a bias potential that reversely biases a PN junction formed between said second region and said substrate.

5. The semiconductor device as claimed in claim 4, wherein said third conductive layer is elongated along said second region and in contact with said second region at a plurality of points.

6. The semiconductor device as claimed in claim 4, wherein said first conductive layer is made of a polycrystalline semiconductor and each of said second and third conductive layers is made of a metal.

7. The semiconductor device as claimed in claim 4, wherein said substrate includes a first portion and a second portion formed on said first portion, said first portion having an impurity concentration larger than that of said second portion, said second region penetrating said second portion to reach said first portion.

8. A semiconductor device comprising a semiconductor substrate of one conductivity type, a well region of opposite conductivity type formed in said substrate, a first field effect transitor having source and drain regions of said one conductivity type formed in said well region, a second field effect transistor having source and drain regions of said opposite conductivity type formed in said substrate, a third field effect transistor having source and drain regions of said opposite conductivity type formed in said substrate separately from said second transistor, an input terminal, a polycrystalline semiconductor layer formed between said input terminal and one of said source and drain regions of said third transistor, a first conductor layer formed between said one of said source and drain regions of said third transistor and the gates of said first and second transistors, a semiconductor region of said opposite conductivity type formed in said substrate so as to surround said third transistor with a junction depth substantially equal to the junction depth of said well region, said semiconductor region completely surrounding said third transistor, and a second conductive layer supplying a bias potential to said semiconductor region to reverse-bias a PN junction formed between said semiconductor region and said substrate.

9. The semiconductor device as claimed in claim 8, wherein the other of said source and drain regions of said third transistor is connected to the gate of said third transistor.

10. A semiconductor device comprising a semiconductor substrate of one conductivity type, a pad on an insulating film provided on said semiconductor substrate, a first region of an opposite conductivity type formed in said semiconductor substrate, a resistor layer of polycrystalline silicon on an insulating film provided on said substrate and electrically connected between said pad and said first region, an insulated gate field effect transistor formed in said semiconductor substrate and having a gate electrode electrically connected to said first region, and a second region of said oposite conductivity type formed in said semiconductor substrate and disposed between said first region and said insulated gate field effect transistor, said second region completely surrounding said first region in a plan view of the device.

11. A semiconductor device comprising a semiconductor substrate of one conductivity type, an input pad formed on an insulating film over said semiconductor substrate, a first region of an opposite conductivity type formed in said dsemiconductor substrate and electrically coupled to said input pad, a field effect transistor formed in said semiconductor substrate and having a gate electrically connected to said first region, a second region of said opposite conductivity type formed in said semiconductor substrate in parallel with said first region, a gate electrode formed on an insulating layer covering a portion of said semiconductor substrate between said first and second regions, said first region, said second region and said gate electrode forming another field effect transistor, means for electrically connecting said gate electrode and said second region to a reference voltage, and a third region of said opposite conductivity type disposed beteen said first region and said field effect transistor and completely surrounding said another field effect transistor in a plan view of the device.

* * * * *